United States Patent
Forlenza et al.

(10) Patent No.: US 8,086,924 B2
(45) Date of Patent: *Dec. 27, 2011

(54) IMPLEMENTING DIAGNOSIS OF TRANSITIONAL SCAN CHAIN DEFECTS USING LOGIC BUILT IN SELF TEST LBIST TEST PATTERNS

(75) Inventors: Donato Orazio Forlenza, Hopewell Junction, NY (US); Orazio Pasquale Forlenza, Hopewell Junction, NY (US); Phong T Tran, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 453 days.

This patent is subject to a terminal disclaimer.

(21) Appl. No.: 12/250,085

(22) Filed: Oct. 13, 2008

(65) Prior Publication Data

US 2010/0095177 A1    Apr. 15, 2010

(51) Int. Cl.
*G01R 31/3177* (2006.01)
*G01R 31/40* (2006.01)
(52) U.S. Cl. .................. 714/731; 714/733
(58) Field of Classification Search .......... None
See application file for complete search history.

(56) References Cited

U.S. PATENT DOCUMENTS

| | | | |
|---|---|---|---|
| 3,761,695 A | 9/1973 | Eichelberger | |
| 5,764,655 A | 6/1998 | Kirihata et al. | |
| 5,983,380 A | 11/1999 | Motika et al. | |
| 6,308,290 B1 | 10/2001 | Forlenza et al. | |
| 6,996,760 B2 * | 2/2006 | Dorsey | 714/733 |
| 7,020,842 B1 * | 3/2006 | DeStefano et al. | 715/741 |
| 7,395,469 B2 | 7/2008 | Anderson et al. | |
| 7,434,130 B2 | 10/2008 | Huisman et al. | |
| 2003/0036869 A1 | 2/2003 | Huisman et al. | |
| 2004/0230882 A1 * | 11/2004 | Huott et al. | 714/733 |
| 2005/0138514 A1 * | 6/2005 | Burdine et al. | 714/733 |
| 2010/0095169 A1 * | 4/2010 | Forlenza et al. | 714/726 |

FOREIGN PATENT DOCUMENTS

JP  2008082888 A  *  4/2008

OTHER PUBLICATIONS

B. Konemann, J. Mucha, G. Zwiehoff, "Built-In Test for Complex Integrated Circuits", IEEE Journal of Solid State Circuits vol. SC-15, pp. 315-318, Jun. 1980.

(Continued)

*Primary Examiner* — Jeffrey A Gaffin
*Assistant Examiner* — Dipakkumar Gandhi
(74) *Attorney, Agent, or Firm* — Joan Pennington

(57) ABSTRACT

A method, apparatus and computer program product are provided for implementing diagnostics of transitional scan chain defects using structural Logic Built In Self Test (LBIST) test patterns. A LBIST test pattern is applied to the device under test and multiple system clock sequences with variable loop control are applied in a passing operating region and scan data is unloaded. The LBIST test pattern is applied to the device under test and multiple system clock sequences with variable loop control are applied in a failing operating region for the device under test and scan data is unloaded. Then the unload data from the passing operating region and the failing operating region are compared. The identified latches having different results are identified as potential AC defective latches. The identified potential AC defective latches are sent to a Physical Failure Analysis system.

20 Claims, 10 Drawing Sheets

OTHER PUBLICATIONS

G. A. Sarrica, B. R. Kessler "Theory and Implementation of LSSD Scan Rind & STUMPS Channel Test and Diagnosis", Sep. 28-3-, 1992, Electronics Manufacturing Technology Symposium, 1992I, Thirteenth IEEE/CHMT International, pp. 195-200.

R. Guo, S. Venkataraman, A Technique for Fault Diagnosis of Defects in Scan Chains, IEEE, paper 10.2, 2001 pp. 268-277, USA.

I. Bayraktaroglu et al., "Gate Level Fault Diagnosis in Scan-Based BIST," Proceedings of the 2002 Design Automation and Test in Europe Conference, 1530-1591/02 IEEE.

Makar, S. R.; McCluskey, E.J.; , "Functional tests for scan chain latches," Test Conference, 1995. Proceedings., International, vol., No., pp. 606-615, Oct. 21-25, 1995 doi: 10.11 09/Test.1995.529889 URL: http://ieeexplore.ieee.org/stamp/stamp.jsp ?tp=&arnu mber=529889&isnu mber= 11 600.

Maka, S.R.; McCluskey, E.J.; , "ATPG for scan chain latches and flip-flops," VLSI Test Symposium, 1997., 15th IEEE, vol., No., pp. 364-369, Apr. 27-May 1, 1997 doi: 10.11 09IVTEST.1997.600306 U RL: http://ieeexplore.ieee.org/stamp/stamp.jsp ?tp=&arnu mber=600306&isnu mber= 13046.

Ruifeng Guo; Venkataraman, S.; , "A technique for fault diagnosis of defects in scan chains," Test Conference, 2001. Proceedings. International, vol., No., pp. 268-277, 2001 doi: 10.11 09/Test.2001. 966642 URL: http://ieeexplore.ieee.org/stamp/stamp.jsp?tp= &arnumber=966642&isnumber=20866.

Yu Huang; Wu-Tung Cheng; Cheng-Ju Hsieh; Huan-Yung Tseng; Alou Huang; Yu-Ting Hung; , "Intermittent scan chain fault diagnosis based on signal probability analysis," Design, Automation and Test in Europe Conference and Exhibition, 2004. Proceedings, vol. 2, No., pp. 1072-1077 Vo1.2, Feb. 16-20, 2004 doi: 10.11 09IDATE.2004. 1269035.

* cited by examiner

IMPLEMENTING DIAGNOSIS OF TRANSITIONAL SCAN CHAIN DEFECTS USING LOGIC BUILT IN SELF TEST LBIST TEST PATTERNS

RELATED APPLICATION

A related United States patent application assigned to the present assignee is being filed on the same day as the present patent application as follows:

United States patent application Ser. No. 12/250,103, by Donato Orazio Forlenza et al., and entitled "IMPLEMENTING ISOLATION OF VLSI AC SCAN CHAIN DEFECTS USING ABIST TEST PATTERNS."

FIELD OF THE INVENTION

The present invention relates generally to the field of testing integrated circuits, and more particularly, relates to a method, apparatus and computer program product for implementing diagnostics of transitional scan chain defects using structural Logic Built In Self Test (LBIST) test patterns.

DESCRIPTION OF THE RELATED ART

Logic level testing of a system at IBM during development of the final manufacturing process of integrated circuits, for example, used in the mainframe activities of the company has been developed since the 1970's, such as disclosed in, Eichelberger, "Method of Level Sensitive Testing a Functional Logic System," U.S. Pat. No. 3,761,695 issued Sep. 25, 1973, Kirihata et al.: "Built in Self Test with Memory," U.S. Pat. No. 5,764,655 issued Jun. 9, 1998, Motika et al., "Weighted Random Pattern Built-in Self-Test," U.S. Pat. No. 5,983,380 issued Nov. 9, 1999, Forlenza et al., "Look Ahead Scan Chain Diagnostic Method," U.S. Pat. No. 6,308,290 issued Oct. 23, 2001; and Anderson et al., "Method for Implementing Deterministic Based Broken Scan Chain Diagnostics," U.S. Pat. No. 7,395,469 issued Jul. 1, 2008.

Diagnosing transitional, delay or AC scan chain defects and rapidly localizing the defects to a failing Shift Register Latch (SRL) remains a difficult and continuing problem for VLSI testing. Typically the problem is encountered early in a technology life cycle and diagnostics is critical for improving the VLSI fabrication process so that manufacturing yield levels can be quickly achieved. An inability to improve the technology and yield of the device can greatly impact a program or at least severely minimize the revenue that could be realized. Rapid diagnosis to a specific location for Physical Failure Analysis (PFA) is needed to understand and correct the process anomalies.

A need exists for a fast and efficient method for implementing isolation or diagnostics of transitional, delay or AC scan chain defects and that provides a defect location for Physical Failure Analysis (PFA).

SUMMARY OF THE INVENTION

Principal aspects of the present invention are to provide a method, apparatus and computer program product for implementing diagnostics of transitional, delay or AC scan chain defects. Other important aspects of the present invention are to provide such method, apparatus and computer program product are provided for implementing diagnostics of transitional, delay or AC scan chain defects substantially without negative effect and that overcome many of the disadvantages of prior art arrangements.

In brief, a method, apparatus and computer program product are provided for implementing diagnostics of transitional scan chain defects using structural Logic Built In Self Test (LBIST) test patterns. A LBIST test pattern is applied to the device under test and multiple system clock sequences are applied in a passing operating region and each scan chain is unloaded. The LBIST test pattern is applied to the device under test and multiple system clock sequences are applied in a failing operating region for the device under test and each scan chain is unloaded. Then the unload data from the passing operating region and the failing operating region are compared. The identified latches having different results are identified as potential AC defective latches. The identified potential AC defective latches are sent to a Physical Failure Analysis system.

In accordance with feature of the invention, the device under test is tested using LBIST patterns across multiple frequencies and voltage conditions. The passing operating region includes multiple frequencies above a predefined voltage and the failing operating region includes multiple frequencies below a predefined voltage. The failing operating region includes a predefined region where the device fails due to timing or voltage.

In accordance with feature of the invention, a scan unload data comparison is performed using a good machine simulator (GMS) to identify a latch causing a transitional scan chain failure.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
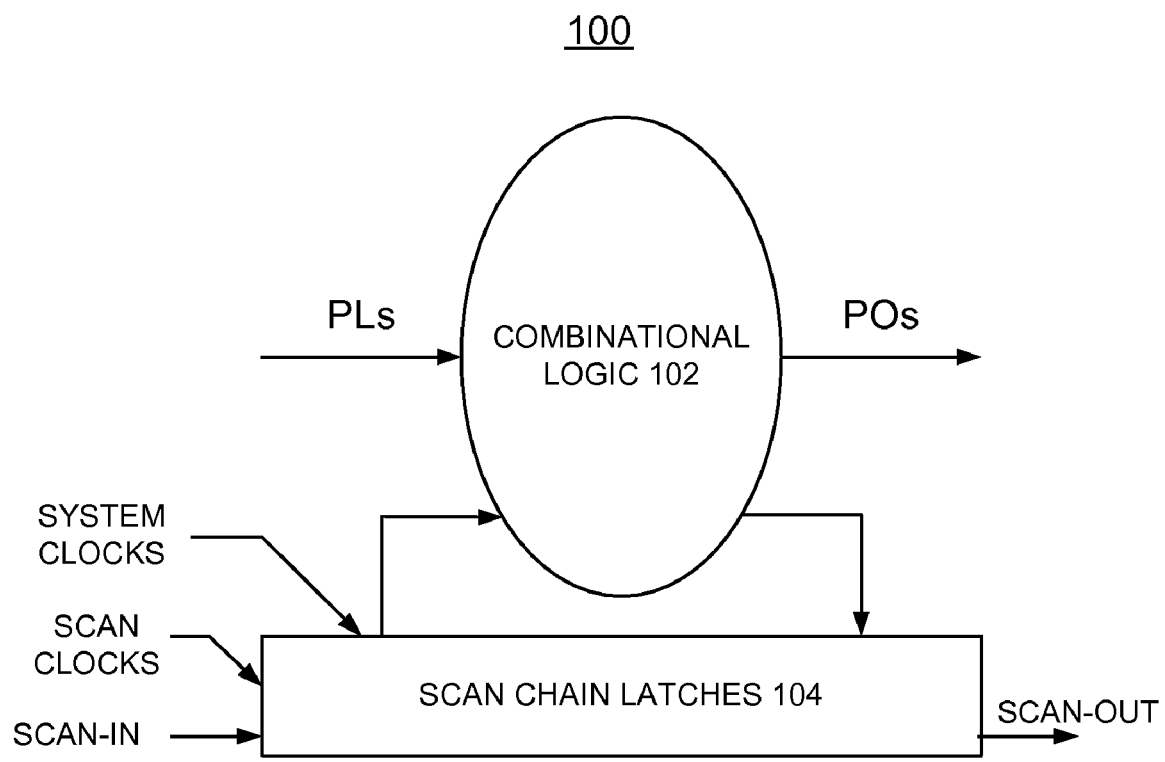
FIGS. 1, 2, 3 and 4 are block diagrams of exemplary scan chain arrangements for use in accordance with the preferred embodiment.

In accordance with features of the invention, a method is provided that utilizes structural Logic Built In Self Test (LBIST) test patterns for diagnostics of transitional, delay or AC scan chain defects.

Referring now to FIGS. 1, 2, 3, and 4, there are shown exemplary scan chain arrangements generally designated by the reference characters 100, 200, 300, 400 for use in accordance with the preferred embodiment. The LSSD methodology is a system design and a Design-For-Test (DFT) approach that incorporates several basic test concepts including a scan design.

Figure 2:
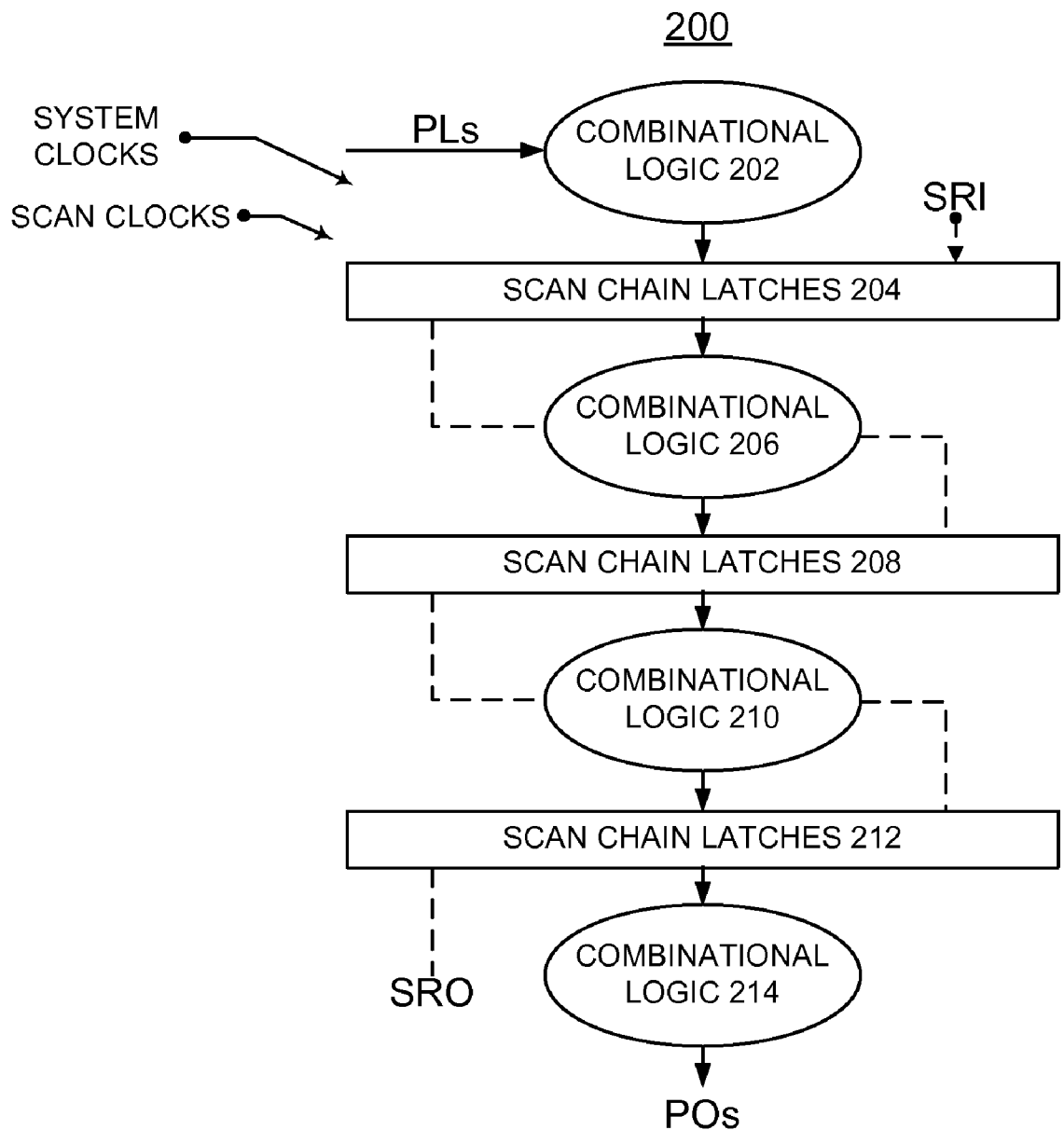

FIGS. 1 and 2 respectively illustrate a typical LSSD structure 100 and a typical LSSD configuration 200. LSSD structure 100 includes combinational logic 102 having applied primary inputs (PIs) and providing primary outputs (POs) and coupled to a scan chain latches block 104. The scan chain latches block 104 having applied system clocks and scan clocks, receives a scan chain input SCAN-IN and provides a scan chain output SCAN-OUT.

LSSD configuration 200 includes a first combinational logic and memory block 202 having applied primary inputs (PIs) and coupled to a first scan chain latches block 204. A second combinational logic and memory block 206 receives primary outputs (POs) from the first scan chain latches block 204 and is coupled to a second scan chain latches block 208. The second scan chain latches block 208 is coupled to a third combinational logic and memory block 210. The third combinational logic and memory block 210 is coupled to a scan chain latches block 212. A fourth combinational logic and memory block 214 receives primary outputs (POs) from the third scan chain latches block 212 and provides primary outputs (POs). In the typical LSSD configuration 200 most of the storage elements of the device, such as latches or registers are concatenated in one or more scan chains 204, 208 212 and can be externally accessible via one or more serial inputs (SRI) and outputs (SRO). Storage elements that are not in this category are usually memory or other special macros that are isolated and tested independently. The LSSD design methodology ensures that all logic feedback paths are gated by one or more of the storage elements, thereby simplifying a sequential design into subsets of combinational logic sections.

Figure 3:
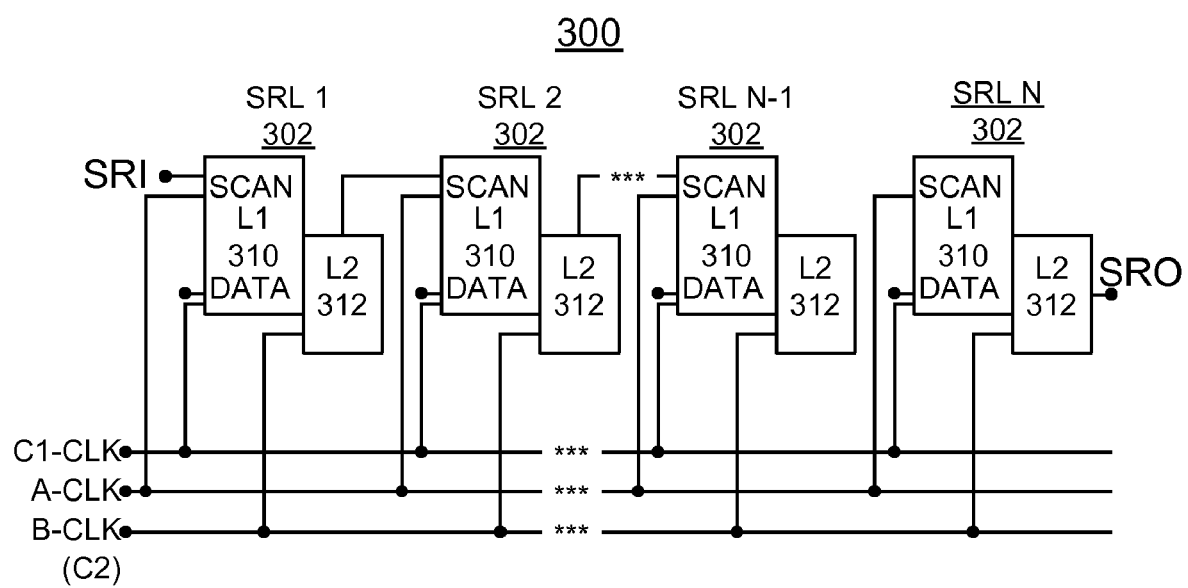

FIG. 3 illustrates a typical LSSD scan chain 300 including a chain of Shift Register Latches (SRLs), 302 SRL1-SRLN, each including a master latch L1, 310 and a slave latch L2, 312. The master latch L1, 310 has a pair of data ports SCAN and DATA, that may be captured by the latch responsive either to a first scan clock A CLK or a first functional system clock C1 CLK. The slave latch L2, 312 captures the value stored in the master latch L1, 310 responsive to either a second scan clock B CLK or a second functional system clock C2 CLK. As shown in FIG. 3, the second scan clock B CLK and the second functional system clock C2 CLK are combined as a single clock signal B CLK (C2). The second scan clock B CLK and the second functional system clock C2 CLK are typically driven out of phase with both the first scan clock A CLK and the first functional system clock C1 CLK applied to the master latch L1, 310.

Figure 4:
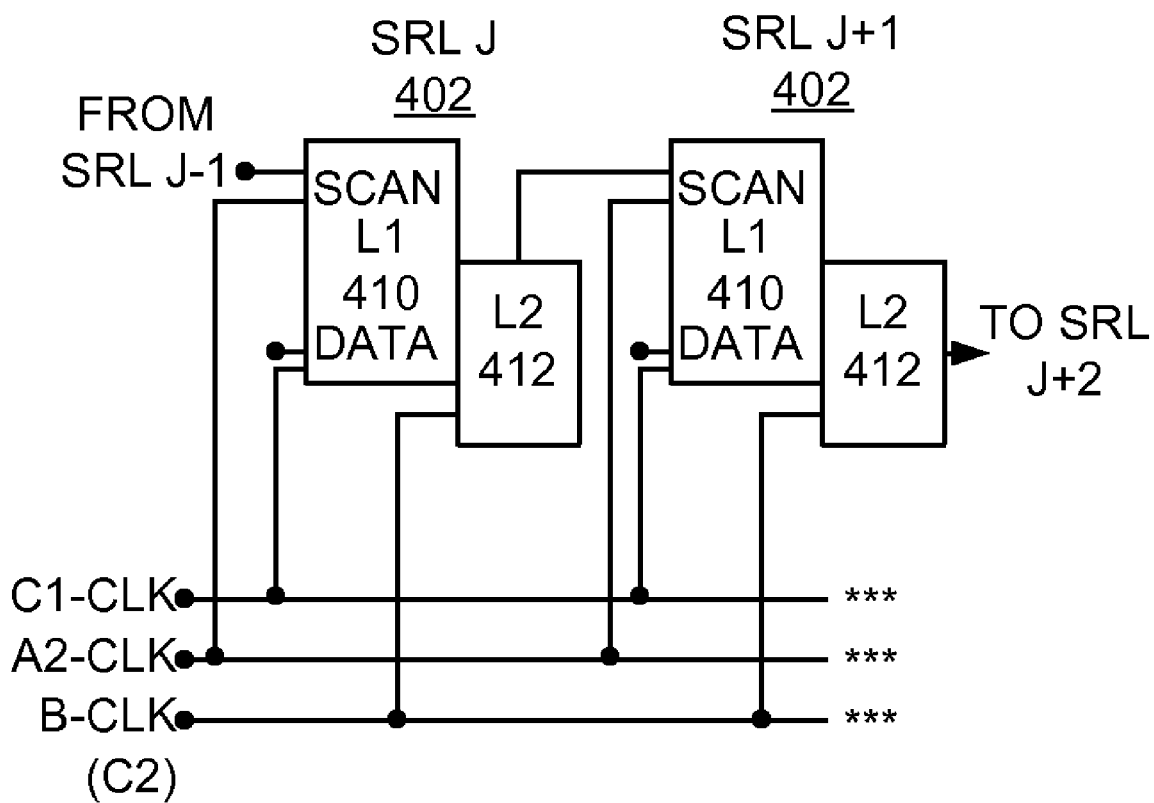

FIG. 4 illustrates a typical LSSD SRL configuration 400 including a first Shift Register Latch (SRL), 402 SRL j and a second Shift Register Latch (SRL), 402, SRL j+1, each including a master latch L1, 410 and a slave latch L2, 412. The first Shift Register Latch (SRL), 402 SRL j has a scan input connected from a prior SRL j−1 (not shown) and the second Shift Register Latch (SRL), 402, SRL j+1 provides a scan input to a next SLR j+2 (not shown), with the other scan input connected to scan clock A2 CLK for both the first and second SRLs 402, SRL j and SRL j+1. The combined second scan clock B CLK and the second functional system clock C2 CLK or the single clock signal B CLK (C2) is applied to the slave latch L2, 412.

Figure 5:
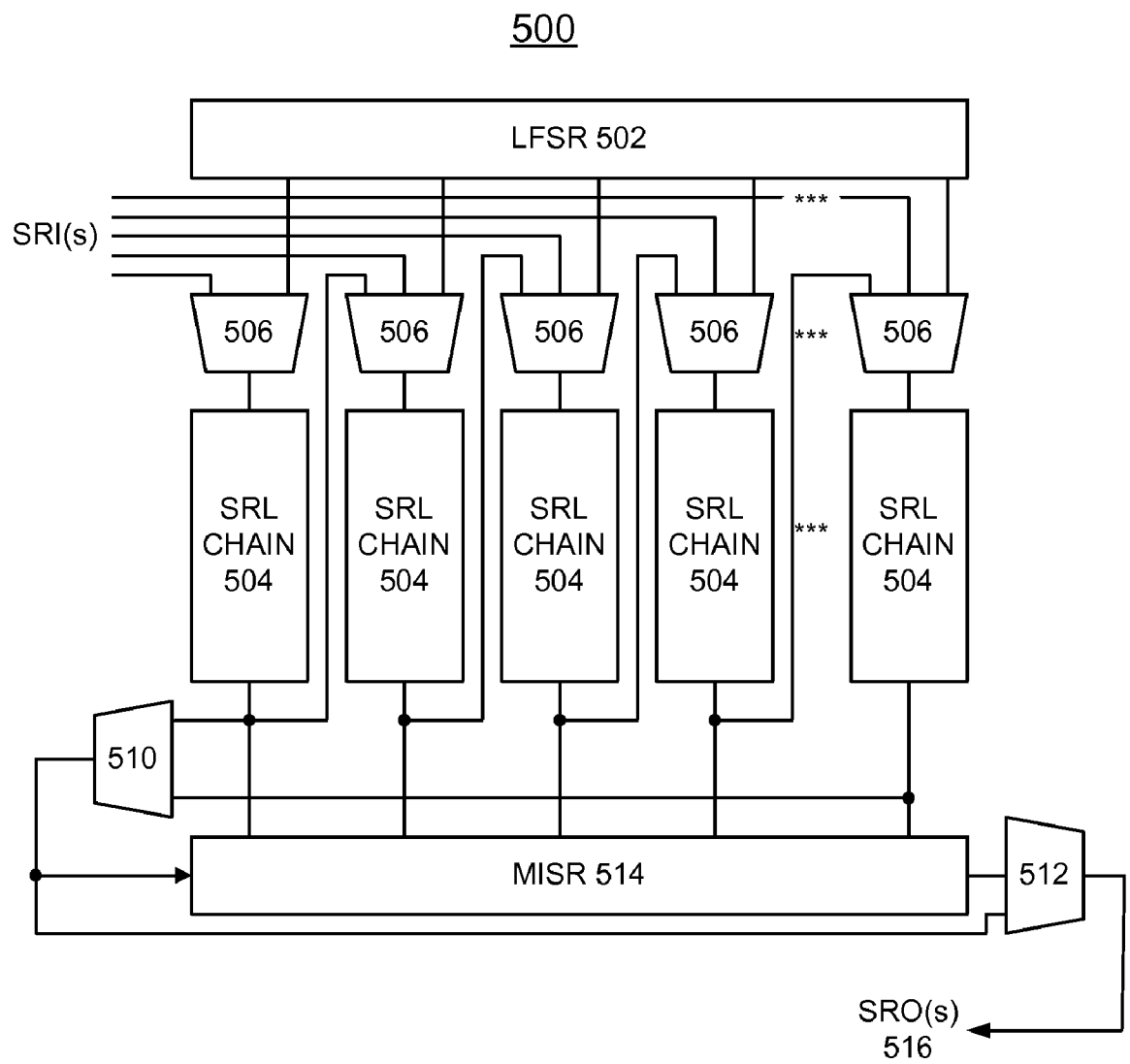
FIG. 5 is a diagram illustrating exemplary Self-Test Using a MISR and a Parallel Shift register sequence generator (STUMPS) system for use in accordance with the preferred embodiment.

Referring now to FIG. 5, there is shown an exemplary Self-Test Using a MISR and a Parallel Shift register sequence generator (STUMPS) structure generally designated by the reference character 500 for use in accordance with the preferred embodiment. The STUMPS structure 500 includes a pseudo-random pattern generator (PRPG) 502 coupled to each of a plurality of SRL chains 504 via a respective multiplexer 506. The STUMPS structure 500 includes a pair of multiplexers 510, 512 and a multiple input signature register (MISR) 514. Each of the SRL chains 504 is connected to the multiple input signature register (MISR) 514. The SRL chains 504 are connected in a ring by the respective multiplexers 506 and the multiplexer 510, which has an output providing an input to the multiple input signature register (MISR) 514. Scan register inputs SRIs are applied to the SRL chains 504 via the respective multiplexers 506. Scan register outputs SROs are provided by the multiplexer 512, which has inputs connected to the MISR 514 and the multiplexer 510.

Figure 6:
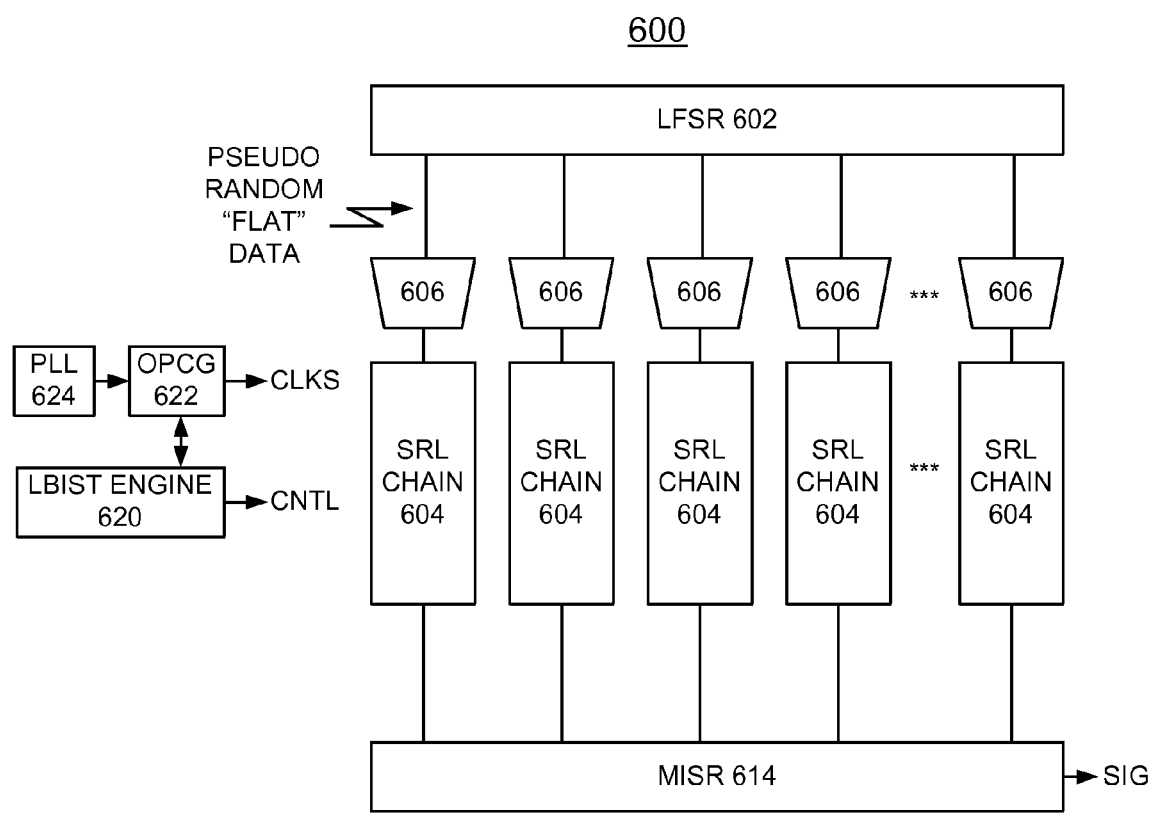
FIG. 6 is a diagram illustrating exemplary Logic Built In Self Test (LBIST) mode STUMPS configuration for implementing diagnostics of transitional, delay or AC scan chain defects using structural Logic Built In Self Test (LBIST) test patterns in accordance with the preferred embodiment.

FIG. 6 illustrates an exemplary Logic Built In Self Test (LBIST) mode STUMPS structure generally designated by the reference character 600 for implementing diagnostics of transitional, delay or AC scan chain defects using structural Logic Built In Self Test (LBIST) test patterns in accordance with the preferred embodiment. LBIST STUMPS structure 600 includes a pseudo-random pattern generator (PRPG) 602 coupled to each of a plurality of SRL chains 604 via a respective multiplexer 606, and a multiple input signature register (MISR) 614. LBIST STUMPS structure 600 includes an LBIST engine 620 generating a control output CNTL and connected to an on-product clock generation (OPCG) function 622 receiving an input from a phase lock loop PLL 624 and providing a clock test sequence and timing set-up output CLKS.

LBIST STUMPS structure 600 includes a configuration of the scan SRL chains 604 in the LBIST test mode being partitioned into multiple sub-chains 604 of approximately the same length. Typically the SRL chains 604 are loaded and unloaded serially for each LBIST test. A pseudo random flat data are loaded in parallel into each SRL chain 604 supplied by the LFSR 602 and used as test stimuli. Similarly, the state of all latches in the sub-chains are unloaded serially into the MISR 614 forming a signature representing the compressed data. Each LBIST test cycle, in addition to the loading and unloading of the sub-chains, requires timed application of system clocks to launch the test vector from these latches through the combinational logic and capture the resulting response in the receiving latches. Since a typical system design may consist of several system clocks and various path delays, the clock test sequence and timing set-up may be applied multiple times with different clock combinations and timings. This is accomplished by the on-product clock generation (OPCG) function 622 and LBIST engine 620 provided control.

An LBIST test interval typically includes a relatively large number of these load/unload sequences followed by the system clock cycle. At the end of the interval the MISR contents or signature is unloaded and compared to an expected signature. Several signature intervals may be applied to achieve the desire test coverage.

In accordance with features of the invention, diagnostics of transitional, delay or AC scan chain defects is accomplished by a method that efficiently utilizes a self-contained and exhaustive diagnostic test pattern set of LBIST test patterns that sensitize and pinpoint an exact AC defective latch within the scan chain of interest. A transition fault models delay or AC defects and is defined as a defect that delays either a rising slow-to-rise (STR) or falling slow-to-fall (STF) transition on any input or output of a logic gate. There are two separate and distinct consecutive patterns that are required in order to successfully detect a transition fault. The first pattern sets up or places the initial transition value at the point of the fault. The second pattern places the final transition value at the point of the fault and propagates the effect to a timed measurable observation point.

In accordance with features of the invention, the transitional scan chain diagnostics is based on using the LBIST engine 620 to repeatedly and randomly broadside stimulate all the latches in the scan chains 604 to isolate the failing Relative Measure Latches (RMLs). The comprehensive latch perturbation, in conjunction with iterative diagnostic algorithms is used to identify and pinpoint the defective location in the scan chain 604 containing the AC defect. Typically, this problem is encountered when one or more scan chains 604 exhibit an AC defect throughout the normal operating range of a device.

In accordance with features of the invention, two modes of unload data comparison can be used in this diagnostic process. The first approach using off-line techniques includes logging all the desired unload data during the test execution and then comparing the unload data to previously generated good unload data. The good unload data generation depends on the type of test and diagnostic problem being addressed.

For example, the representative unload data are generated prior to test via a good machine simulator (GMS) and stored on the tester or computer test system. This may require relatively large unload data storage capacity on the tester, but needs to be performed only once. If an interactive GMS is readily available during test, the storage problem can be significantly reduced.

For example, another or second approach, which is very powerful in some situations, is to used the same device under test to generate the good reference unload data. This can be accomplished when the device has an operating range that is functioning properly. Also this operating range might be at a slightly different voltage or timing conditions.

This novel diagnostic method of the invention has been implemented in engineering development mode with successful results. Numerous AC defects have been successfully diagnosed with successful PFA isolation, defect identification, and resolution using this AC diagnostic.

Figure 7:
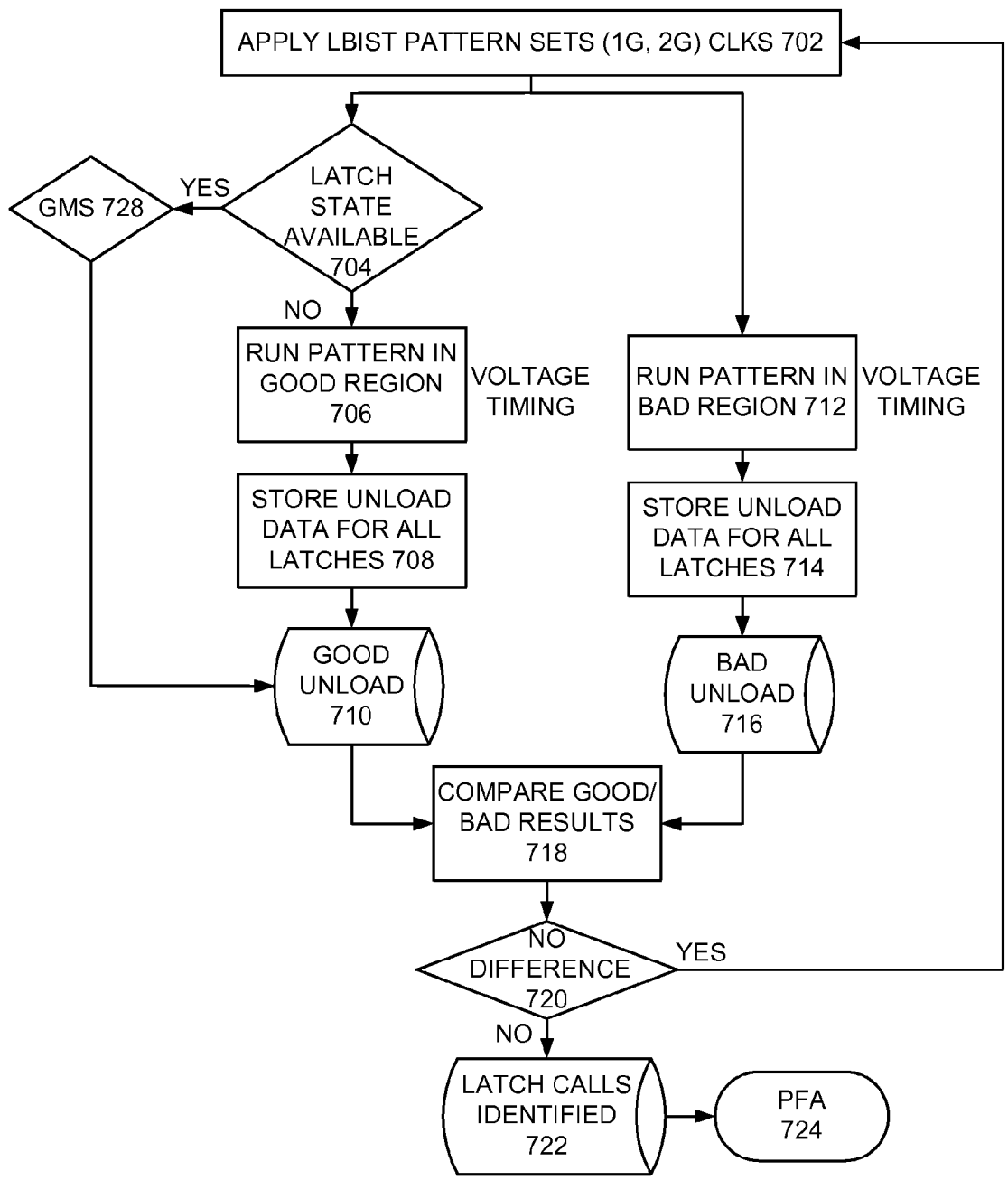
FIG. 7 is a flow chart illustrating exemplary steps for implementing diagnostics of transitional, delay or AC scan chain defects using structural Logic Built In Self Test (LBIST) test patterns in accordance with the preferred embodiment.

Referring now to FIG. 7, there are shown exemplary steps for implementing diagnostics of transitional, delay or AC scan chain defects using structural Logic Built In Self Test (LBIST) test patterns in accordance with the preferred embodiment. Different LBIST tests are applied to a device under test. A given LBIST pattern and multiple clock sequences are applied to the device under test as indicated at a block 702. Multiple clock sequences present different data at the functional ports of the scan chain latches. Each clocking sequence will potentially provide enough random data so that each sequence will equally insert a "1" or "0" into each latch via the function or system port.

Checking for available latch state is performed as indicated at a decision block 704. When the available latch state is not available, then the LBIST pattern is run in a good region for the device under test.

Figure 8:
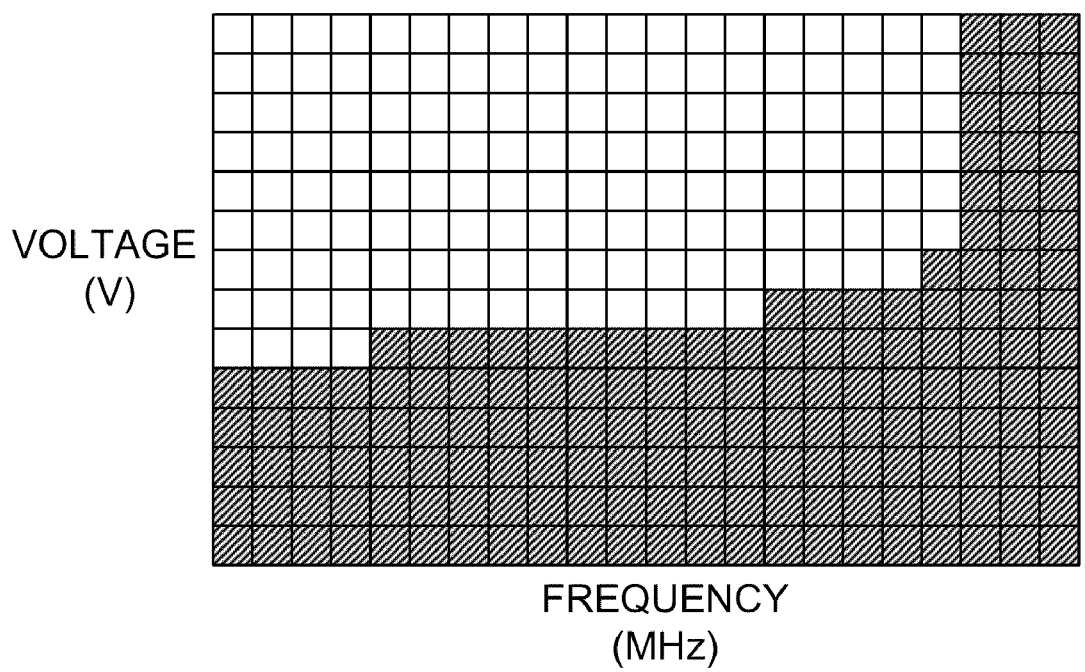
FIG. 8 is a diagram illustrating exemplary voltage and frequency values utilized for diagnostics of transitional, delay or AC scan chain defects using structural Logic Built In Self Test (LBIST) test patterns in accordance with the preferred embodiment.

Referring also to FIG. 8, there are shown exemplary voltage and frequency values utilized for diagnostics of transitional, delay or AC scan chain defects using structural Logic Built In Self Test (LBIST) test patterns in accordance with the preferred embodiment. FIG. 8 illustrates a passing and a failing region indicated by cross-hatching.

The device under diagnostics is tested using LBIST patterns across many frequencies and voltage conditions at block 706. The device under diagnostics is tested in the good region and all its latches are dumped with unload data stored for all latches as indicated at a block 708. The good region stored data is indicated at a block 710.

Similarly, the device is tested in the failing or bad region and the latches are dumped. A bad region is one where the device fails due to timing or voltage. FIG. 8 illustrates a passing region that is generally above 0.9 Volts and a failing region generally below 0.9 Volts within a selected frequency range.

The LBIST pattern is run in a bad region for the device under test as indicated at a block 712. The device under diagnostics is tested in the bad region and all its latches are dumped with unload data stored for all latches as indicated at a block 714. The bad region stored unload data is indicated at a block 716.

In accordance with features of the invention, the SRLs of the device under diagnostics is dumped anywhere in the failing region as well as anywhere in the passing region. A comparison is done to identify the latch causing the scan chain to fail.

The unload data from the good and bad region are compared as indicated at a block 718. Then in accordance with features of the invention the latches that are different or miss-compare are reported. These miss-compare latches are potential candidates for where the AC defect lies within the scan chain.

A simple off-line comparison of these data unloads for each operating point is performed and hence, the differing latches are identified at block 718. When no difference is identified as indicated at a decision block 720, then another LBIST pattern is applied returning to block 702. Otherwise the differing latches are then stored as indicated at a block 722 and sent to a Physical Failure Analysis system (PFA) as indicated at a block 724. When the latch state is available at decision block 204, then a scan unload data comparison is performed using a good machine simulator (GMS) as indicated at a decision block 728 that is stored on the tester or system under test, and the result stored with the good region unload data at block 710.

Some latches might be expected to differ at compare block 728, for example, due to a combination of logic/array, power-up, and unstable latch conditions. These latch types are characterized and identified prior to the diagnostic process and can be simply cross-referenced against the diagnostic latch calls obtained via this process at block 722. These latches advantageously are excluded from the final list of suspect AC defective latch calls for submission to PFA at block 722. Therefore, the AC defective SRLs are then identified as the SRLs that differ between the unload data of the good and bad operating region minus these unstable latches.

In accordance with features of the invention, the method for diagnostics of transitional, delay or AC scan chain defects using structural Logic Built In Self Test (LBIST) test patterns advantageously is automated and used in a manufacturing environment.

Figure 9:
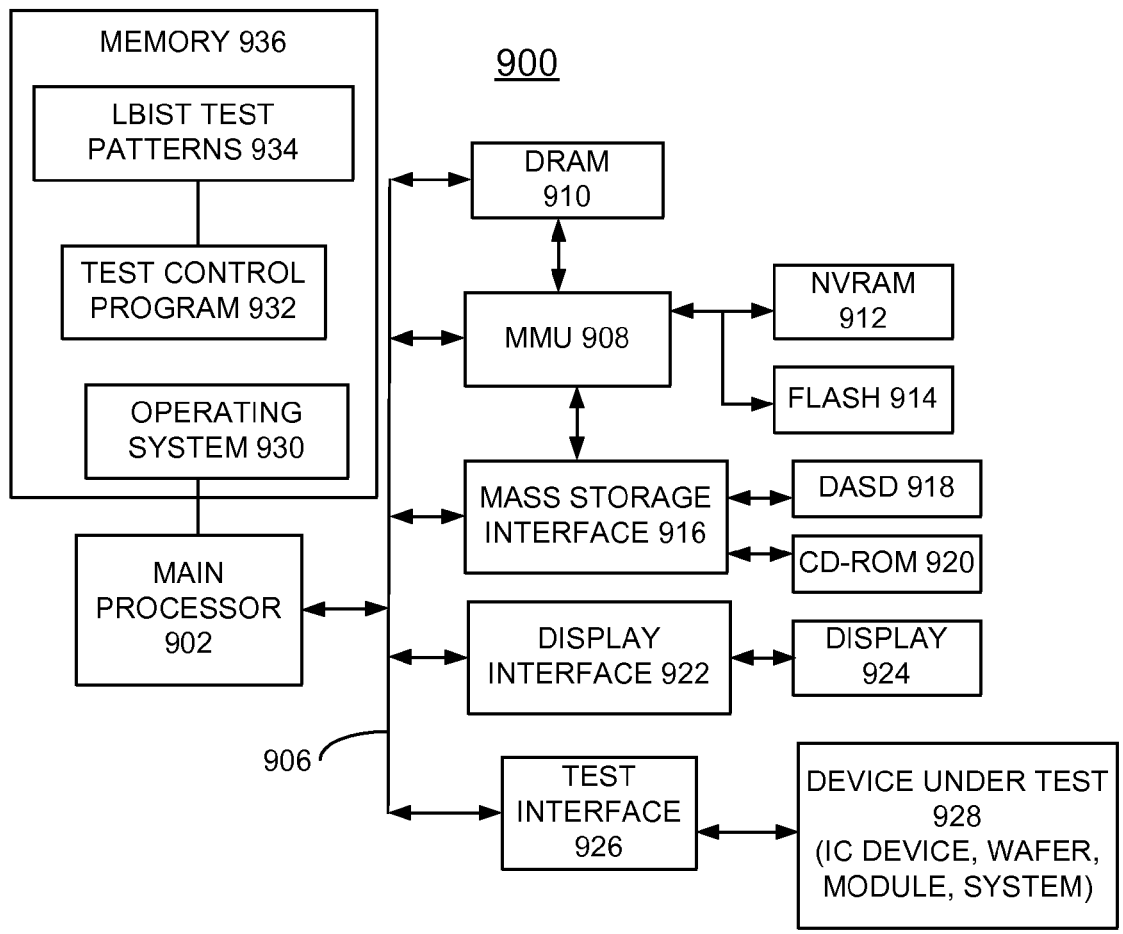
FIG. 9 is a block diagram representations illustrating an exemplary computer test system for implementing diagnostics of transitional, delay or AC scan chain defects using structural Logic Built In Self Test (LBIST) test patterns in accordance with the preferred embodiment.

In FIG. 9 there is shown an exemplary computer test system generally designated by the reference character 900 for implementing LBIST scan chain diagnostics in accordance with the preferred embodiment. Computer system 900 includes a main processor 902 or central processor unit (CPU) 902 coupled by a system bus 906 to a memory management unit (MMU) 908 and system memory including a dynamic random access memory (DRAM) 990, a nonvolatile random access memory (NVRAM) 912, and a flash memory 914. A mass storage interface 916 coupled to the system bus 906 and MMU 908 connects a direct access storage device (DASD) 918 and a CD-ROM drive 920 to the main processor 902. Computer system 900 includes a display interface 922 connected to a display 924, and a test interface 926 coupled to the system bus 906. A device under test 928 is coupled to the test interface 926. The device under test 928 includes, for example, an integrated circuit wafer, a module, or a system. Computer system 900 includes an operating system 930, a test control program 932, and a set of LBIST test patterns 934 of the preferred embodiment resident in a memory 936.

Computer test system 900 is shown in simplified form sufficient for understanding the present invention. The illustrated computer test system 900 is not intended to imply architectural or functional limitations. The present invention can be used with various hardware implementations and systems and various other internal hardware devices, for example, multiple main processors.

Figure 10:
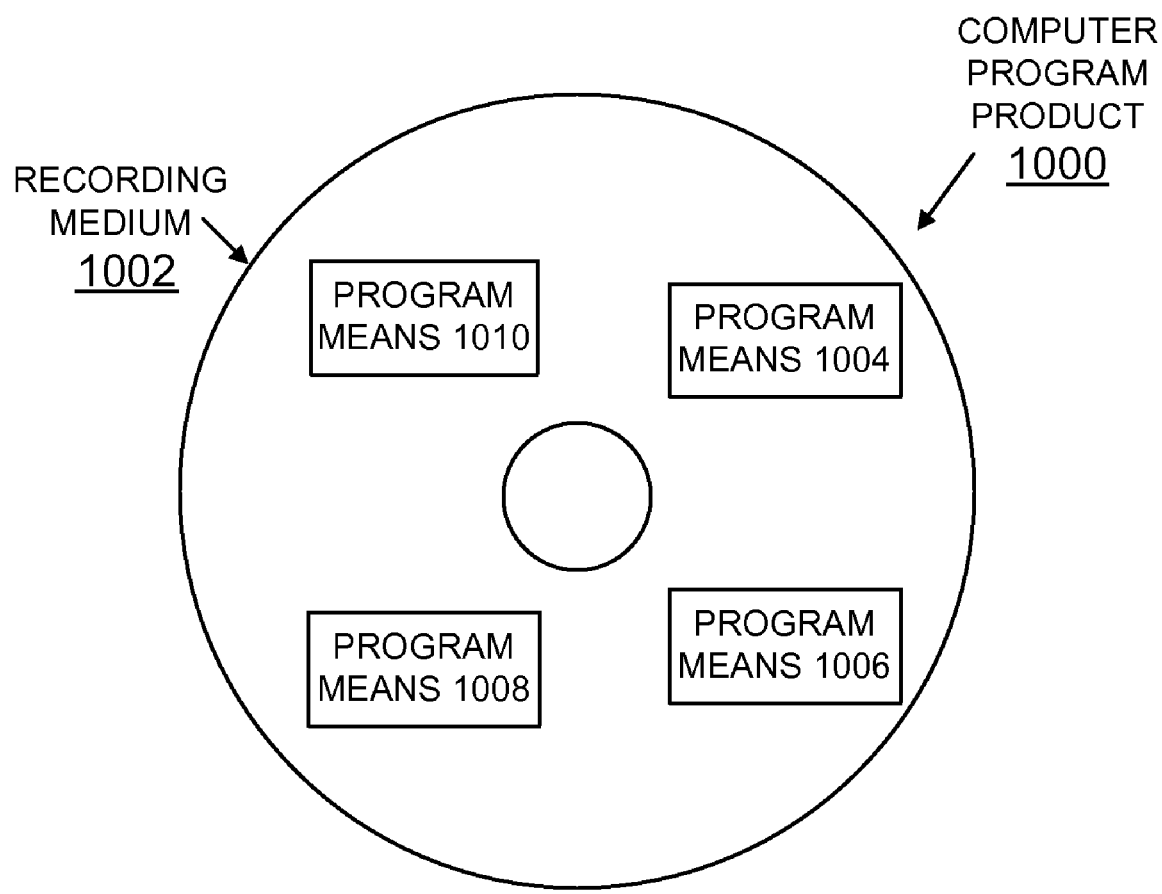
FIG. 10 is a block diagram illustrating a computer program product in accordance with the preferred embodiment.

Referring now to FIG. 10, an article of manufacture or a computer program product 1000 of the invention is illustrated. The computer program product 1000 includes a recording medium 1002, such as, a floppy disk, a high capacity read only memory in the form of an optically read compact disk or CD-ROM, a tape, or another similar computer program product. Recording medium 1002 stores program means 1004, 1006, 1008, 1010 on the medium 1002 for carrying out the methods for implementing diagnostics of transitional, delay or AC scan chain defects of the preferred embodiment in the system 900 of FIG. 9.

A sequence of program instructions or a logical assembly of one or more interrelated modules defined by the recorded program means 1004, 1006, 1008, 1010, direct the computer test system 900 for implementing diagnostics of transitional, delay or AC scan chain defects of the preferred embodiment.

While the present invention has been described with reference to the details of the embodiments of the invention shown in the drawing, these details are not intended to limit the scope of the invention as claimed in the appended claims.

What is claimed is:

1. A method for implementing diagnostics of transitional scan chain defects using structural Logic Built In Self Test (LBIST) test patterns comprising the steps of:
using a voltage and frequency timing control and determining a passing operating region and a failing operating region for a device under test;
applying an LBIST test pattern to the device under test and applying multiple system clock sequences and varying voltage and frequency timing parameters in the passing operating region for the device under test and unloading scan chain data;
applying the LBIST test pattern to the device under test and applying multiple system clock sequences and varying voltage and frequency timing parameters in the failing operating region for the device under test and unloading scan chain data;
comparing the unload data from the passing operating region and the failing operating region;
identifying each latch having different results as a potential AC defective latch; and
sending the identified potential AC defective latches to a Physical Failure Analysis system.

2. The method for implementing diagnostics of transitional scan chain defects using structural Logic Built In Self Test (LBIST) test patterns as recited in claim 1 wherein comparing the unload data from the passing operating region and the failing operating region includes identifying consistent results, selecting another LBIST test pattern; and repeating the testing steps.

3. The method for implementing diagnostics of transitional scan chain defects using structural Logic Built In Self Test (LBIST) test patterns as recited in claim 1 wherein the passing operating region for the device under test includes multiple frequencies and voltage conditions.

4. The method for implementing diagnostics of transitional scan chain defects using structural Logic Built In Self Test (LBIST) test patterns as recited in claim 1 wherein the failing operating region includes a predefined region where the device fails due to an operating frequency or voltage condition.

5. The method for implementing diagnostics of transitional scan chain defects using structural Logic Built In Self Test (LBIST) test patterns as recited in claim 1 wherein the passing operating region includes multiple operating frequencies above a predefined voltage.

6. The method for implementing diagnostics of transitional scan chain defects using structural Logic Built In Self Test (LBIST) test patterns as recited in claim 1 wherein the failing operating region includes multiple operating frequencies below a predefined voltage.

7. The method for implementing diagnostics of transitional scan chain defects using structural Logic Built In Self Test (LBIST) test patterns as recited in claim 1 includes performing a scan unload data comparison of unload data from the passing operating region with a good machine simulator (GMS) to identify a latch causing a transitional scan chain failure.

8. The method for implementing diagnostics of transitional scan chain defects using structural Logic Built In Self Test (LBIST) test patterns as recited in claim 1 wherein the steps of applying an LBIST test pattern to the device under test and applying multiple system clock sequences includes repeatedly and randomly broadside stimulating all latches in the scan chains to isolate a failing Relative Measure Latch (RML).

9. An apparatus for implementing diagnostics of transitional scan chain defects using structural Logic Built In Self Test (LBIST) test patterns comprising:
an LBIST test pattern set;
a test control program using a voltage and frequency timing control and determining a passing operating region and a failing operating region for a device under test; applying an LBIST test pattern to the device under test and applying multiple system clock sequences and varying voltage and frequency timing parameters in the passing operating region for the device under test and unloading scan chain data; applying the LBIST test pattern to the device under test and applying multiple system clock sequences and varying voltage and frequency timing parameters in the failing operating region for the device under test and unloading scan chain data; comparing the unload data from the passing operating region and the failing operating region; identifying each latch having different results as a potential AC defective latch; and sending the identified potential AC defective latches to a Physical Failure Analysis system.

10. The apparatus for implementing diagnostics of transitional scan chain defects using structural Logic Built In Self Test (LBIST) test patterns as recited in claim 9 wherein said test control program selects another LBIST test pattern, responsive to comparing the unload data from the passing operating region and the failing operating region and identifies consistent results.

11. The apparatus for implementing diagnostics of transitional scan chain defects using structural Logic Built In Self Test (LBIST) test patterns as recited in claim 9 wherein said test control program performs a scan unload data comparison of unload data from the passing operating region with a good machine simulator (GMS) to identify a latch causing a transitional scan chain failure.

12. The apparatus for implementing diagnostics of transitional scan chain defects using structural Logic Built In Self Test (LBIST) test patterns as recited in claim 9 wherein said test control program runs LBIST test pattern in the device under test under multiple frequencies and voltage conditions in both the passing operating region and the failing operating region for the device under test.

13. The apparatus for implementing diagnostics of transitional scan chain defects using structural Logic Built In Self Test (LBIST) test patterns as recited in claim 9 wherein said test control program repeatedly and randomly broadside stimulates all latches in the scan chains to isolate a failing Relative Measure Latch (RML) with applying the LBIST test pattern to the device under test.

14. The apparatus for implementing diagnostics of transitional scan chain defects using structural Logic Built In Self Test (LBIST) test patterns as recited in claim 9 wherein the passing operating region includes multiple operating frequencies above a predefined voltage.

15. The apparatus for implementing diagnostics of transitional scan chain defects using structural Logic Built In Self Test (LBIST) test patterns as recited in claim 9 wherein the failing operating region includes multiple operating frequencies below a predefined voltage.

16. A computer program product for implementing diagnostics of transitional scan chain defects using structural Logic Built In Self Test (LBIST) test patterns in a device under test in a computer test system, said computer program product including instructions stored on a computer recording medium consisting one of a floppy disk, an optically read compact disk, a compact disk read only memory (CD-ROM), and a tape, wherein said instructions, when executed by the computer test system to cause the computer system to perform the steps of:

using a voltage and frequency timing control and determining a passing operating region and a failing operating region for the device under test;

applying an LBIST test pattern to the device under test and applying multiple system clock sequences and varying voltage and frequency timing parameters in the passing operating region for the device under test and unloading scan chain data;

applying the LBIST test pattern to the device under test and applying multiple system clock sequences and varying voltage and frequency timing parameters in the failing operating region for the device under test and unloading scan chain data;

comparing the unload data from the passing operating region and the failing operating region;

identifying each latch having different results as a potential AC defective latch; and sending the identified potential AC defective latches to a Physical Failure Analysis system.

17. The computer program product for implementing diagnostics of transitional scan chain defects using structural Logic Built In Self Test (LBIST) test patterns in the device under test as recited in claim 16 includes comparing the unload data from the passing operating region and the failing operating region includes identifying consistent results, selecting another LBIST test pattern; and repeating the testing steps.

18. The computer program product for implementing diagnostics of transitional scan chain defects using structural Logic Built In Self Test (LBIST) test patterns in the device under test as recited in claim 16 includes performing a scan unload data comparison of unload data from the passing operating region with a good machine simulator (GMS) to identify a latch causing a transitional scan chain failure.

19. The computer program product for implementing diagnostics of transitional scan chain defects using structural Logic Built In Self Test (LBIST) test patterns in the device under test as recited in claim 16 wherein the steps of applying an LBIST test pattern to the device under test and applying multiple system clock sequences includes repeatedly and randomly broadside stimulating all latches in the scan chains to isolate a failing Relative Measure Latch (RML).

20. The computer program product for implementing diagnostics of transitional scan chain defects using structural Logic Built In Self Test (LBIST) test patterns in the device under test as recited in claim 16 wherein the steps of applying an LBIST test pattern to the device under test and applying multiple system clock sequences includes running the LBIST test pattern in the device under test under multiple frequencies and voltage conditions in both the passing operating region and the failing operating region for the device under test.

* * * * *